(12) United States Patent
Pathakota et al.

(10) Patent No.: US 8,578,240 B1
(45) Date of Patent: Nov. 5, 2013

(54) CRC COMPUTATION FOR PACKET LENGTH NOT MULTIPLE OF DATA PATH WIDTH

(75) Inventors: Ravi Pathakota, Bangalore (IN); Abhijeet Sampatrao Jadhav, Bangalore (IN); Sai Kishore, Gudivada (IN); Naveen Jain, Bangalore (IN)

(73) Assignee: Juniper Networks, Inc., Sunnyvale, CA (US)

( * ) Notice: Subject to any disclaimer, the term of this patent is extended or adjusted under 35 U.S.C. 154(b) by 356 days.

(21) Appl. No.: 13/011,445

(22) Filed: Jan. 21, 2011

(51) Int. Cl.
*H03M 13/00* (2006.01)

(52) U.S. Cl.
USPC ......................................................... 714/758

(58) Field of Classification Search
USPC .......................................... 714/746, 758, 776
See application file for complete search history.

(56) References Cited

U.S. PATENT DOCUMENTS 5,027,357 A * 6/1991 Yu et al. ........................ 714/758
7,793,194 B2 * 9/2010 Seo et al. ...................... 714/776

OTHER PUBLICATIONS

Adrian Simionescu et al., "CRC Tool—Computing CRC in Parallel for Ethernet", http://www.nobugconsulting.com/crc_details.pdf, 2001, pp. 1-6.
Co-pending U.S. Appl. No. 12/539,684, filed Aug. 12, 2009 entitled "Regeneration of Packet CRC", by Ravi Pathakota, 28 pages.

* cited by examiner

*Primary Examiner* — Shelly A Chase
(74) *Attorney, Agent, or Firm* — Harrity & Harrity, LLP

(57) ABSTRACT

A communication device may include a cyclic redundancy check (CRC) calculator. The CRC calculator may determine a packet remainder of a packet based on a data path width associated with the communication device; append zeros to the packet remainder to generate an appended packet remainder equal in size to the data path width; compute a first CRC value for the appended packet; reverse bits of the computed first CRC value to obtain a reversed CRC value; multiply the bit reversed CRC value with a value based on a reciprocal CRC polynomial to generate a multiplication product; compute a second CRC value for the generated multiplication product based on the reciprocal CRC polynomial; and reverse bits of the second CRC value to generate a CRC for the packet.

20 Claims, 7 Drawing Sheets

CRC COMPUTATION FOR PACKET LENGTH NOT MULTIPLE OF DATA PATH WIDTH

BACKGROUND

Digital communication networks include communication devices that exchange digital data in the form of data units. When a data unit is transmitted (e.g., over an electrical, an optical, or a wireless connection) from one communication device to another communication device, noise and/or interference may change, degrade, or otherwise alter the data unit. Error detection techniques may be used to determine whether a data unit has been altered after being transmitted by a source communication device. One error checking technique includes the use of a cyclic redundancy check (CRC) function. A CRC value may be computed for a data unit and appended to the data unit prior to transmission. A receiving device may receive the data unit, with the appended CRC value, may compute a CRC value for the data unit, and may compare the computed CRC value with the received CRC value. If the two values differ, an error may be detected. However, performing an error checking computation using a CRC function may not always be straightforward.

SUMMARY OF THE INVENTION

According to one aspect, a communication device may include a cyclic redundancy check (CRC) calculator. The CRC calculator may determine a packet remainder based on a data path width associated with the communication device; append zeros to the packet remainder to generate an appended packet remainder equal in size to the data path width; compute a first CRC value for the appended packet; reverse bits of the computed first CRC value to obtain a reversed CRC value; perform modulo 2 multiplication for the bit reversed CRC value with a value based on a reciprocal CRC polynomial to generate a multiplication product; compute a second CRC, based on reciprocal polynomial for the generated multiplication product; and reverse bits of the second CRC value to generate a CRC for the packet.

According to another aspect, a method, performed by a communication device, may include determining, by the communication device, a packet remainder based on a data path width associated with the communication device; appending, by the communication device, zeros to the packet remainder to generate an appended packet remainder equal in size to the data path width; computing, by the communication device, a first cyclic redundancy check (CRC) value for the appended packet; reversing, by the communication device, bits of the computed CRC value to obtain a bit reversed CRC value; multiplying based on modulo 2 arithmetic, by the communication device, the bit reversed CRC value with a value based on a reciprocal CRC polynomial to generate a multiplication product; computing, by the communication device, a second CRC based on reciprocal polynomial, for the generated multiplication product; and reversing, by the communication device, bits of the second CRC value to generate a CRC for the packet.

According to yet another aspect, a computer-readable medium, storing instructions executable by a processor, may include one or more instructions to determine a packet remainder based on a data path width associated with the communication device; one or more instructions to append zeros to the packet remainder to generate an appended packet remainder equal in size to the data path width; one or more instructions to compute a first CRC value for the appended packet; one or more instructions to reverse bits of the computed CRC value to generate a bit reversed CRC value; one or more instructions to multiply the bit reversed CRC value with a value based on a reciprocal CRC polynomial to generate a multiplication product; multiplication is based on modulo 2 arithmetic; one or more instructions to compute a second CRC based on reciprocal polynomial for the generated multiplication product; and one or more instructions to reverse bits of the second CRC value to generate a CRC for the packet.

BRIEF DESCRIPTION OF THE DRAWINGS

The accompanying drawings, which are incorporated in and constitute a part of this specification, illustrate the invention and, together with the description, explain the invention. In the drawings.

DETAILED DESCRIPTION

The following detailed description of the invention refers to the accompanying drawings. The same reference numbers may be used in different drawings to identify the same or similar elements. Also, the following detailed description does not limit the invention. Instead, the scope of the invention is defined by the appended claims and equivalents.

An implementation described herein may relate to computation of a CRC for packets with a packet length that is not a multiple of a data path width. A communication device may process packets based on a particular data path width. A data path width may refer to a number of bits that the communication device processes in parallel (e.g., during a same clock cycle) with respect to a particular function or process. The communication device may calculate a CRC for a packet based on a particular data path width. However, a size of a packet may not be a multiple of the data path width and dividing a packet into segments of data path width size may result in a remainder. As an example, the communication device may compute CRCs based on a data path width of 32 bits. If a packet is 64 bits long, starting with an initial CRC value (e.g., all bits set to 1), a CRC value may be computed using the initial CRC value and a first 32 bit segment of the packet to generate a first CRC value. A second CRC value may then be computed using the first CRC value and a second 32 bit segment of the packet. The second CRC value may correspond to the CRC value of the packet. However, if a packet is 70 bits long, a CRC value computed using a third segment of 6 bits (70−(2×32)=6) may not generate a correct CRC value.

An implementation described herein may append zeros to a packet remainder to generate a packet segment of a size that equals to a data path width, computing a CRC value for the appended packet, reversing the bits of the CRC value to obtain a bit reversed value, multiplying the bit reversed value by a CRC value based on a reciprocal CRC polynomial, computing a CRC value of the multiplied result based on the reciprocal polynomial, and reversing the bits of the computed CRC value to arrive at the correct CRC for the packet. The CRC value based on a reciprocal CRC polynomial may be stored in a look up table that includes a value for each possible length of the remainder and is computed using the reciprocal CRC polynomial. The reciprocal CRC polynomial may be generated by reversing the bits of the CRC polynomial.

Bits of a packet may be represented as coefficients of a packet polynomial P(X) and standard way of computing CRC as in case of Ethernet is to compute CRC on packet polynomial with initial CRC as all 1's. From here on standard CRC computation function is represented as $CRC_s(P(X))$. Standard CRC, $CRC_s(P(X))$ may also be computed after complementing first 'k' bits of the packet and appending 'k' zeros at the end of the packet, and with initial CRC as all zeros. Also from here on to avoid ambiguity with other literature, CRC on packet polynomial without complementing first 'k' bits and without appending 'k' zeros at the end of packet and with initial CRC as all zeroes is represented as $CRC_p(P(X))$.

$$CRC_p(P(X)) = \text{Remainder of } (P(X)/G(X))$$

Where division is based on modulo 2 arithmetic, G(X) is the generator CRC polynomial and 'k' is the order of the generator CRC polynomial For a packet, instead of computing standard CRC 'C'

$$C = CRC_s(P(X)) \quad (1),$$

by appending zeros at the end of the packet remainder, the following value may be computed:

$$C_1 = CRC_s(P(X)*2^{(W-N)*8}) \quad (2),$$

where $C_1$ represents the CRC computed based on the appended packet (which may not correspond to the correct CRC for the packet), W represents the data path width in bytes, and N represents the size of the packet remainder in bytes. Furthermore, computing a CRC for a product of two different values may be expressed by the following equation:

$$CRC_s(A*B) = CRC_p(CRC_s(A)*CRC_p(B)) \quad (3)$$

Where B is 2 to the power of 'x' and 'x' can be any +ve integer less than the degree of the CRC polynomial.
Combining equation (3) and equation (2) yields:

$$C_1 = CRC_p(CRC_p(2^{(W-N)*8})*C) \quad (4)$$

Given $C_1$, C may be computed using a reciprocal CRC polynomial. A reciprocal CRC polynomial may be created by assigning the $x^n$ through $x^0$ coefficients of the CRC polynomial to the $x^0$ through $x^n$ coefficients of the new polynomial. This may correspond to reversing the bits of the CRC polynomial. For example, the CRC polynomial for Ethernet frames, known as the Ethernet polynomial, is 0x104c11db7. The reciprocal polynomial of the Ethernet polynomial may be represented as 0x1db710641.

Using equation (4) with the reciprocal CRC polynomial yields:

$$C^r = CRC_{rp}(CRC_{rp}(2^{(W-N)*8}) \cdot C_1^r) \quad (5)$$

where $C^r$ represents the bit reverse of C, where $CRC_{rp}$ represents a $CRC_p$ function using the reciprocal CRC polynomial, and where $C_1^r$ represents the bit reverse of $C_1$. $CRC_{rp}(2^{(W-N)8})$ may be pre-computed for the particular value of N, and may be represented as $Y_{W-N}$. Equation (5) may then be expressed as:

$$C^r = CRC_{rp}(Y_{W-N} \cdot C_1^r) \quad (6)$$

To generate C, the bits of $C^r$ may be reversed.

Figure 1:
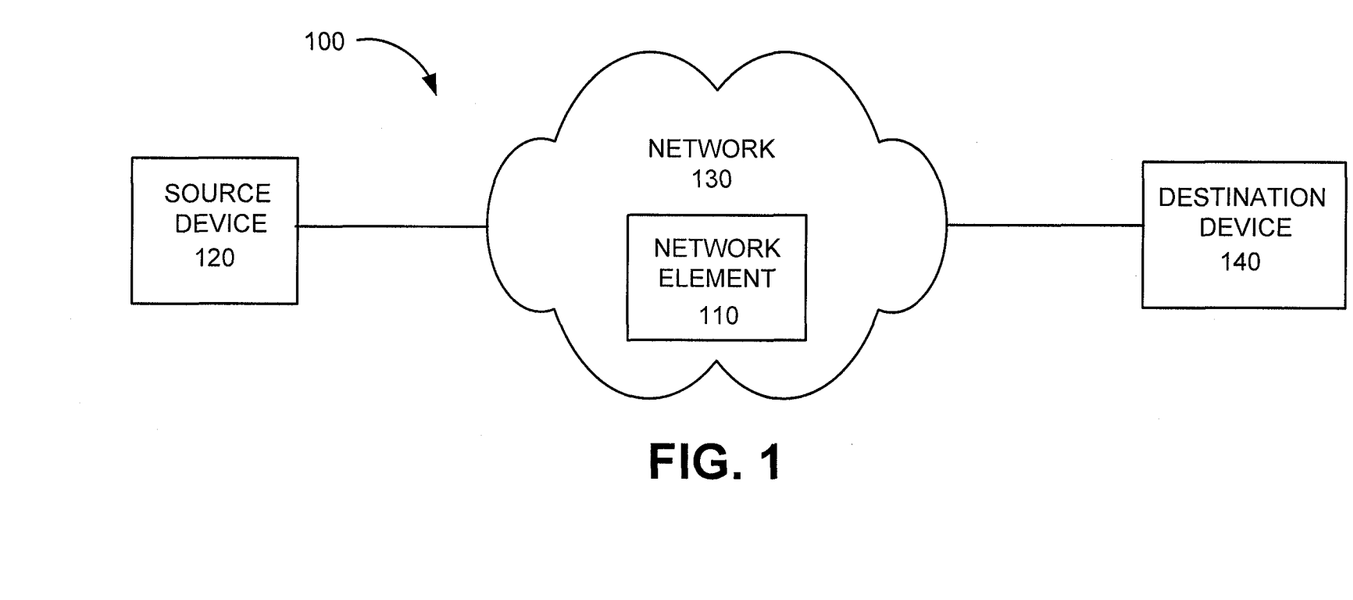
FIG. 1 is a diagram illustrating an example system according to an implementation described herein.

FIG. 1 is a diagram illustrating an example system 100 according to an implementation described herein. As shown in FIG. 1, system 100 may include one or more network elements 110 (referred to herein individually as "network element 110" and collectively as "network elements 110"), a source device 120, a network 130, and a destination device 140. Source device 120 may send packets to destination device 140 through network 130 via network element 110. While a single network element 110 is illustrated in FIG. 1 for simplicity, network 130 may include many network elements 110 and a route traveled by packets from source device 120 to destination device 140 may include multiple, and possibly a large number of, network elements 110.

Network element 110 may include any device that receives and transmits packets within a network or between networks. Network element 110 may include, for example, a gateway, a router, a switch, a firewall, a network interface card (NIC), a hub, a bridge, a proxy server, an optical add-drop multiplexer (OADM), and/or some other type of device (e.g., a layer 2 and/or layer 3 device) that processes and/or transfers traffic. Network element 110 may include one or more ingress interfaces and one or more egress interfaces. Network element 110 may receive a packet at one of the ingress interfaces, determine a destination of the received packet, determine an egress interface based on the determined destination, and forward the packet via the determined egress interface. Additionally, network element 110 may determine whether to forward the received packet or whether to drop the received packet.

Source device 120 and destination device 140 may include a same type of device or different types of devices. For example, source device 120 and destination device 140 may include any device with a communication function, such as a personal computer or workstation, a server device, a portable computer, a voice over Internet Protocol (VoIP) telephone device, a radiotelephone, a portable communication device (e.g. a mobile phone, a global positioning system (GPS) device, or another type of wireless device), a content recording device (e.g., a camera, a video camera, etc.), a gaming system, an access point base station, a cellular base station, and/or any type of network element encompassed by network element 110.

Network 130 may include one or more types of networks. A "packet" may refer to a packet, a datagram, or a cell; a fragment of a packet, a fragment of a datagram, or a fragment of a cell; or another type, arrangement, or packaging of data. For example, network 130 may include one or more of a local area network (LAN), a wide area network (WAN), a metropolitan area network (MAN), an optical network, a cable television network, a satellite television network, a wireless network (e.g., a Code Division Multiple Access (CDMA) network, a general packet radio service (GPRS) network, and/or an LTE network), an ad hoc network, a telephone network (e.g., the Public Switched Telephone Network (PSTN) or a cellular network), an intranet, the Internet, or a combination of these networks or other types of networks.

Although FIG. 1 shows example components of system 100, in other implementations, system 100 may include fewer components, different components, differently arranged components, and/or additional components than depicted in FIG. 1. Additionally or alternatively, one or more components of system 100 may perform one or more tasks described as being performed by one or more other components of system 100.

Figure 2:
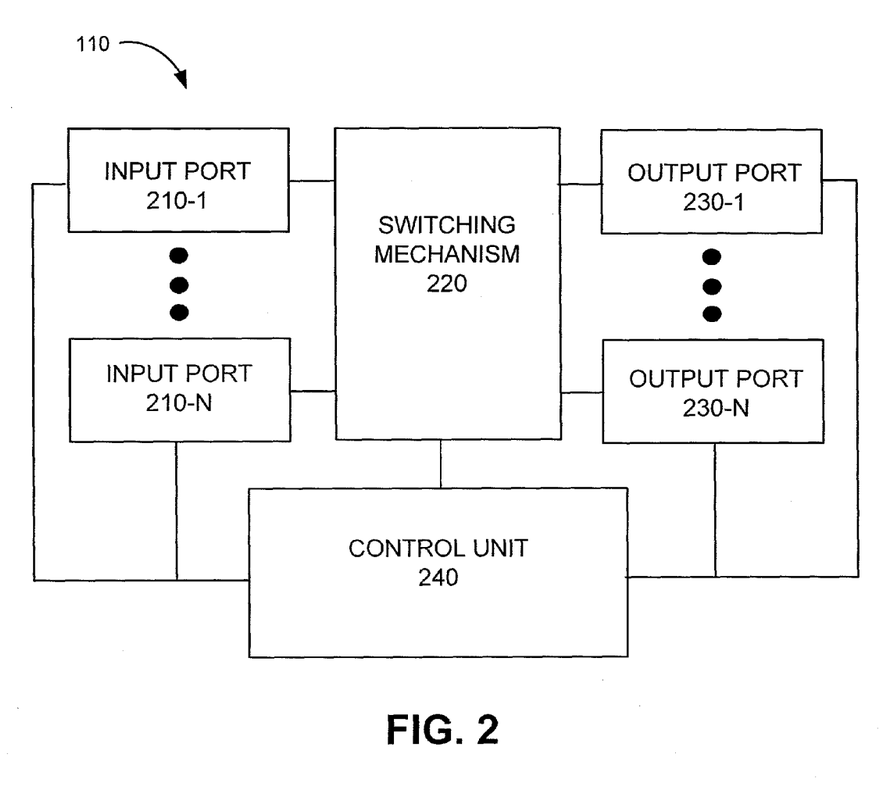
FIG. 2 is a diagram illustrating example components of a network device of the system of FIG. 1 according to an implementation described herein.

FIG. 2 is a diagram illustrating example components of network element 110 of the system of FIG. 1 according to an implementation described herein. As shown in FIG. 2, network element 110 may include one or more input ports 210-1 to 210-N (referred to herein individually as "input port 210" and collectively as "input ports 210"), a switching mechanism 220, one or more output ports 230-1 to 230-N (referred to herein individually as "output port 230" and collectively as "output ports 230"), and/or a control unit 240.

Input ports 210 may be the points of attachments for physical links and may be the points of entry for incoming traffic. An input port 210 may be associated with an interface card (not shown in FIG. 2). Switching mechanism 220 may include one or more switching planes to facilitate communication between input ports 210 and output ports 230. In one implementation, each of the switching planes may include a single or multi-stage switch of crossbar elements. In another implementation, each of the switching planes may include some other form(s) of switching elements. Additionally or alternatively, switching mechanism 220 may include one or more processors, one or more memories, and/or one or more paths that permit communication between input ports 210 and output ports 230.

Output ports 230 may store traffic received from input ports 210 and may schedule the traffic on one or more output physical links. Output port 230 may be associated with an interface card (not shown in FIG. 1). Control unit 240 may interconnect with input ports 210, switching mechanism 220, and/or output ports 230 and may perform control plane operations associated with network element 110. For example, control unit 240 may use routing protocols and may create a forwarding table that is used in traffic forwarding.

Although FIG. 2 shows example components of network element 110, in other implementations, network element 110 may include fewer components, different components, differently arranged components, and/or additional components than depicted in FIG. 2. Additionally or alternatively, one or more components of network element 110 may perform one or more tasks described as being performed by one or more other components of network element 110.

Figure 3:
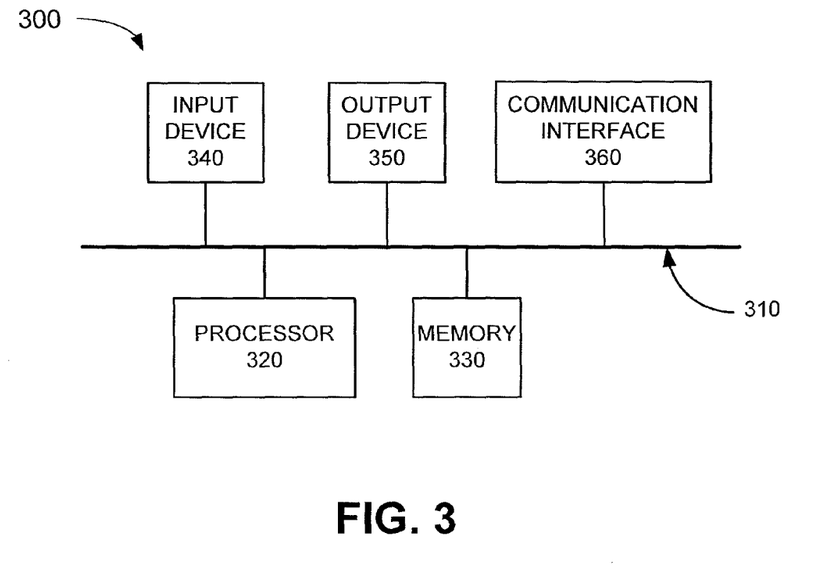
FIG. 3 is a diagram illustrating example components of a device, which may correspond to one of the components of the network device of FIG. 2, according to a first implementation described herein.

FIG. 3 is a diagram illustrating example components of a device 300 according to a first implementation described herein. Device 300 may correspond to one or more of the components of network element 110, such as input port 210, switching mechanism 220, output port 230, and/or control unit 240, or a combination thereof. Each of input port 210, switching mechanism 220, output port 230, and/or control unit 240 may include one or more devices 300. As shown in FIG. 3, device 300 may include a bus 310, a processor 320, a memory 330, an input device 340, an output device 350, and a communication interface 360.

Bus 310 may include a path that permits communication among the components of device 300. Processor 320 may include one or more processors, microprocessors, or processing logic (e.g., application specific integrated circuits (ASICs) or field programmable gate arrays (FPGAs)) that may interpret and execute instructions. Memory 330 may include a random access memory (RAM) device or another type of dynamic storage device that may store information and instructions for execution by processor 320, a read only memory (ROM) device or another type of static storage device that may store static information and instructions for use by processor 320, a magnetic and/or optical recording memory device and its corresponding drive, and/or a removable form of memory, such as a flash memory.

Input device 340 may include a mechanism that permits an operator to input information to device 300, such as a keyboard, a button, or an input jack for an input device such as a keypad or a keyboard, etc. Output device 350 may include a mechanism that outputs information to the operator, including one or more light indicators, a display, a speaker, etc.

Communication interface 360 may include any transceiver-like mechanism that enables device 300 to communicate with other devices and/or systems. For example, communication interface 360 may include a modem, a network interface card, and/or a wireless interface card.

As will be described in detail below, device 300 may perform certain operations. Device 300 may perform these operations in response to processor 320 executing software instructions contained in a computer-readable medium, such as memory 330. A computer-readable medium may be defined as one or more logical or physical memory devices. A logical memory device may include space within a single physical memory device or spread across multiple physical memory devices.

The software instructions may be read into memory 330 from another computer-readable medium, or from another device via communication interface 360. The software instructions contained in memory 330 may cause processor 320 to perform processes that will be described later. Alternatively, hardwired circuitry may be used in place of or in combination with software instructions to implement processes described herein. Thus, implementations described herein are not limited to any specific combination of hardware circuitry and software.

Although FIG. 3 shows example components of device 300, in other implementations, device 300 may include fewer components, different components, additional components, or differently arranged components than depicted in FIG. 3. Additionally or alternatively, one or more components of device 300 may perform one or more tasks described as being performed by one or more other components of device 300.

While FIGS. 1-3 describe an implementation in the context of network element 110, another implementation may implement a device that does not include network element 110, but rather include a different type of communication device. Thus, the method of computing a CRC for packets with a packet length that is not a multiple of a data path width, which is described herein, may be implemented in any communication device that sends or receives packets.

Figure 4:
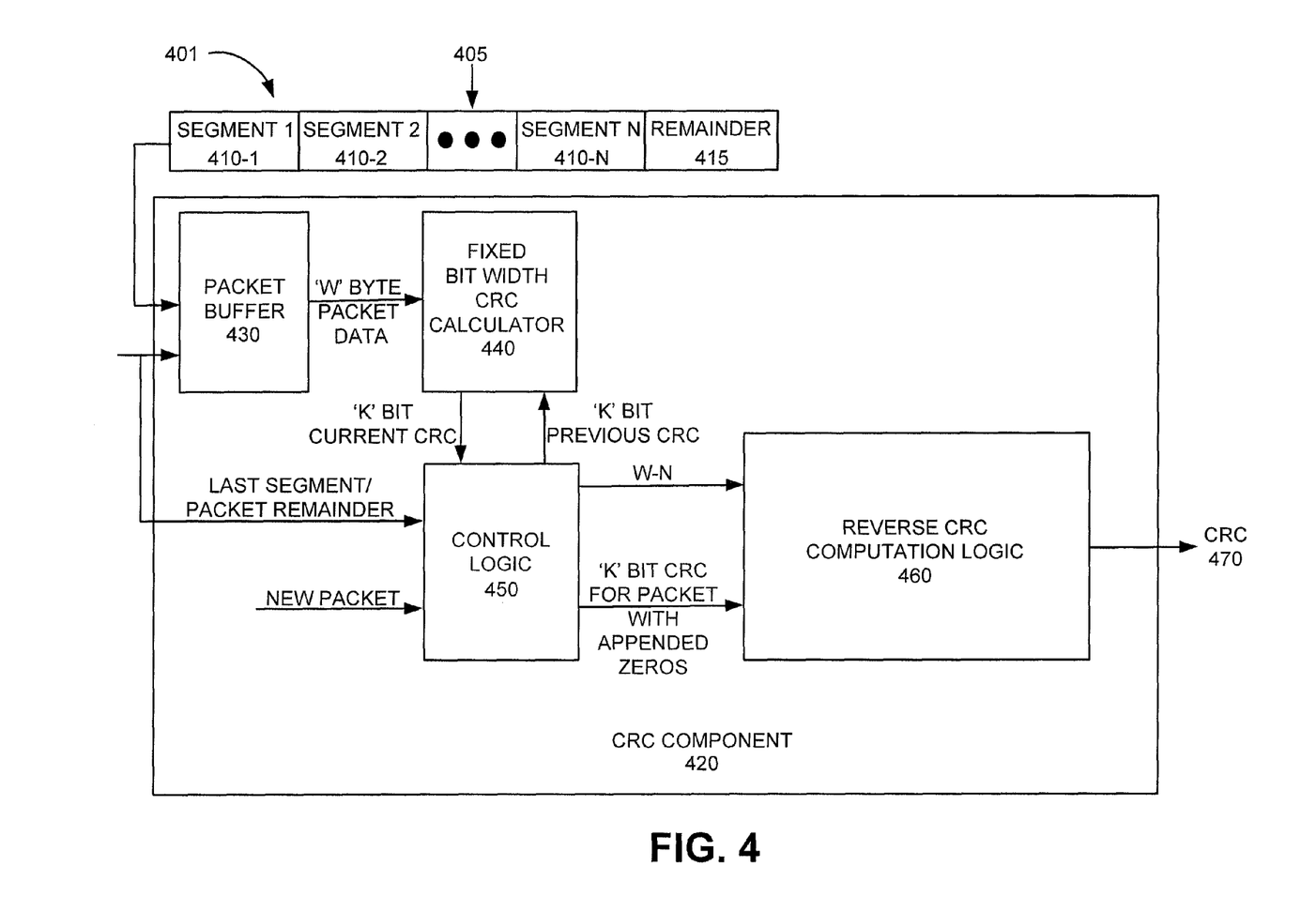
FIG. 4 is a diagram illustrating a first example of a configuration to compute a CRC according to an implementation described herein.

FIG. 4 is a diagram illustrating an example configuration 401 to compute a CRC that may be implemented in device 300 according to an implementation described herein. As shown in FIG. 4, configuration 401 may include serial processing of packet 410 by CRC component 420. Packet 410 may include packet segments 410-1 through 410-N (referred to herein individually as "packet segment 410" and collectively as "packet segments 410"), where each packet segment has a size equal to the data path width, and a packet remainder 415, which has a size less than the data path width. As shown in FIG. 4, CRC component 420 may include one or more functional components, including a packet buffer 430, a fixed width CRC calculator 440, a control logic 450, and a reverse CRC computation logic 460.

Packet buffer 430 may receive packet 405 and store packet 405 while packet 405 is being processed by CRC component 420. Packet buffer 430 may provide packet segments 410 to fixed width CRC calculator 440 one segment at a time. For example, in one implementation, packet buffer 430 may provide one packet segment 410 to fixed width CRC calculator 440 per clock cycle of device 300. Packet buffer 430 may determine when the size of remaining packet data, to be provided to fixed width CRC calculator 440, is less than the size of a segment. The remaining packet data may correspond to remainder 415. In one implementation, packet buffer 430 may determine the size of the remaining packet data based on a packet size value included in a header (not shown in FIG. 4) of packet 405. In another implementation, packet buffer 430 may determine the size of the remaining packet data using another technique.

Packet buffer 430 may append zeros to remainder 415 to generate an appended packet remainder of a size corresponding to the data path width. For example, if the size of packet remainder 415 is N bytes and the data path width is W bytes, packet buffer 430 may append (W−N) bytes to packet remainder 415. Packet buffer 430 may provide the appended packet remainder to fixed width CRC calculator 440 and may provide an indication, that the appended packet remainder has been provided to fixed width CRC calculator 440, to control logic 450.

Fixed width CRC calculator 440 may calculate a CRC value for a current packet segment 410 of size W, based on a previously computed CRC value. For example, fixed width CRC calculator 440 may receive an initial CRC value from control logic 450 and first packet segment 410-1 from packet buffer 430. The initial CRC value may be set to a value of all 1's. Fixed width CRC calculator 440 may compute a current 'k' bit CRC value based on the initial CRC value and bits of first packet segment 410-1 and may forward the current 'k' bit CRC value to control logic 450. Fixed width CRC calculator 440 may then receive second packet segment 410-2 from packet buffer 430 and may receive a previous 'k' bit CRC value from control logic 450 (corresponding to the CRC value computed based on the first packet segment 410-1). Fixed width CRC calculator 440 may continue to compute a CRC value for packet 405 using a next packet segment 410 and the previously computed CRC value.

Control logic 450 may keep track of the CRC value being computed for packet 405. For example, control logic 450 may provide an initial CRC value to fixed width CRC calculator 440 and may receive a 'k' bit current CRC value from fixed width CRC calculator 440. During a next clock cycle, control logic 450 may provide the received 'k' bit current CRC value to fixed width CRC calculator 440 as a 'k' bit previous CRC value. Control logic 450 may receive, from packet buffer 430, an indication that packet remainder 415, with appended zeros, has been provided to fixed width CRC calculator 440. Control logic may receive 'k' bit CRC value for packet 405 with appended zeros, which may correspond to value $C_1$ from Equation (4). The $C_1$ value may be provided to reverse CRC computation logic 460, along with an indication of the number of zeros that have been appended (e.g., corresponding to the value W-N, where W corresponds to the data path width and N corresponds to the size of remainder 415).

Reverse CRC computation logic 460 may receive, from control logic 450, a $C_1$ value corresponding to a 'k' bit CRC value for packet 405 with W-N appended zeros. Reverse CRC computation logic 460 may also receive a value corresponding to W-N from control logic 450. Reverse CRC computation logic 460 may compute a correct CRC value 470 for packet 405 based on the received $C_1$ value and the received W-N value.

Although FIG. 4 shows example functional components of CRC component 420, in other implementations, CRC component 420 may include fewer functional components, different functional components, differently arranged functional components, and/or additional functional components than depicted in FIG. 4. Additionally or alternatively, one or more functional components of CRC component 420 may perform one or more tasks described as being performed by one or more other functional components of CRC component 420. Furthermore, packet 405 may include fewer components, different components, differently arranged components, and/or additional components than depicted in FIG. 4.

Figure 5:
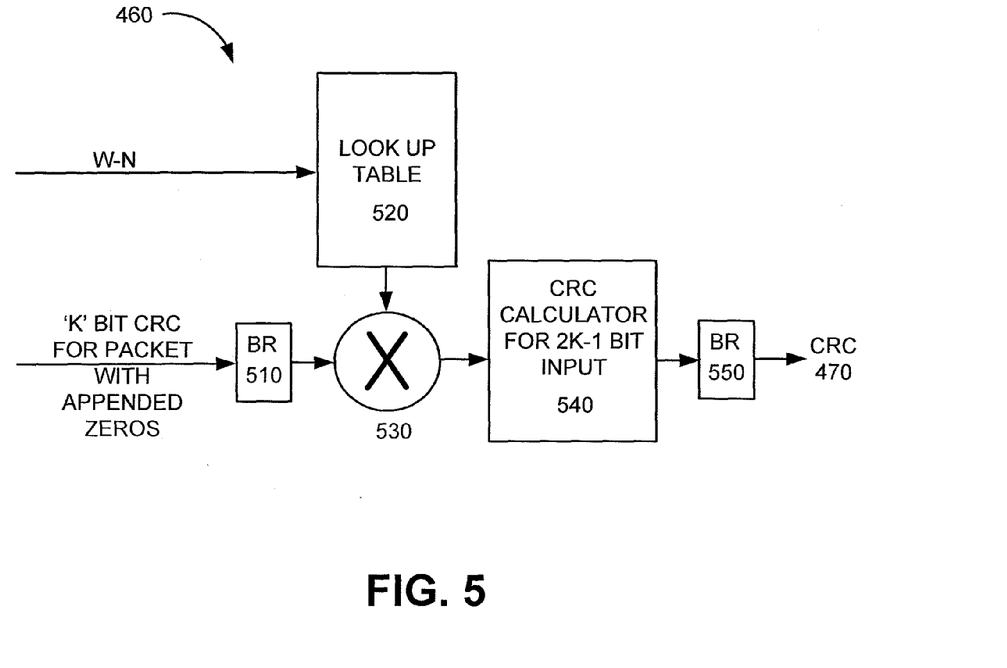
FIG. 5 is a diagram illustrating example functional components of a device for computing a cyclic redundancy check value for a packet according to the first implementation described herein.

FIG. 5 is a first diagram illustrating example components of reverse CRC computation logic 460 according to an implementation described herein. As shown in FIG. 5, reverse CRC computation logic 460 may include a first bit reverser 510, a look up table 520, a modulo 2 multiplier 530, a CRC calculator for 2k−1 bit input 540, and a second bit reverser 540.

First bit reverser 510 may reverse the bits of an input value. For example, if the input to first bit reverser 510 corresponds to bits 10110111, bit reverser 520 may output bits 11101101.

Look up table 520 may store pre-computed CRC values computed using a reverse CRC polynomial for corresponding sizes of packet remainder 415. Look up table 520 is described in more detail below with reference to FIG. 6.

Multiplier 530 may multiply two binary input values to generate a product of the two binary input values. Multiplier 530 may be based on Modulo 2 arithmetic. Multiplier 530 may receive a bit reversed value of $C_1$ from first bit reverser 510 and may receive a $Y_{W-N}$ value (see Equation (6)), selected based on a W-N value received from control logic 450, and may multiply the bit reversed $C_1$ value with the $Y_{W-N}$ value. Multiplier 530 may provide the multiplied product to CRC calculator for 2k−1 bit input 540.

CRC calculator for 2k−1 bit input 540 may compute a CRC value for the multiplied product received from multiplier 530 to generate the $C'$ value of Equation (6), which corresponds to a bit reversed version of correct CRC value 470 for packet 405.

Second bit reverser 550 may reverse the bits of the computed CRC value to generate correct CRC value 470 for packet 405.

The implementation of reverse CRC computation logic 460 shown in FIG. 5 may provide an efficient technique for computing CRC value of packet 405 by implementing a CRC computation that only involves k bit multiplication based on modulo 2 arithmetic, where k corresponds to the order of the CRC polynomial, and a reduction on a result of size 2k−1 using a reciprocal CRC polynomial.

Although FIG. 5 shows example functional components of reverse CRC computation logic 460, in other implementations, reverse CRC computation logic 460 may include fewer functional components, different functional components, differently arranged functional components, and/or additional functional components than depicted in FIG. 5. Additionally or alternatively, one or more functional components of reverse CRC computation logic 460 may perform one or more tasks described as being performed by one or more other functional components of reverse CRC computation logic 460.

Figure 6:
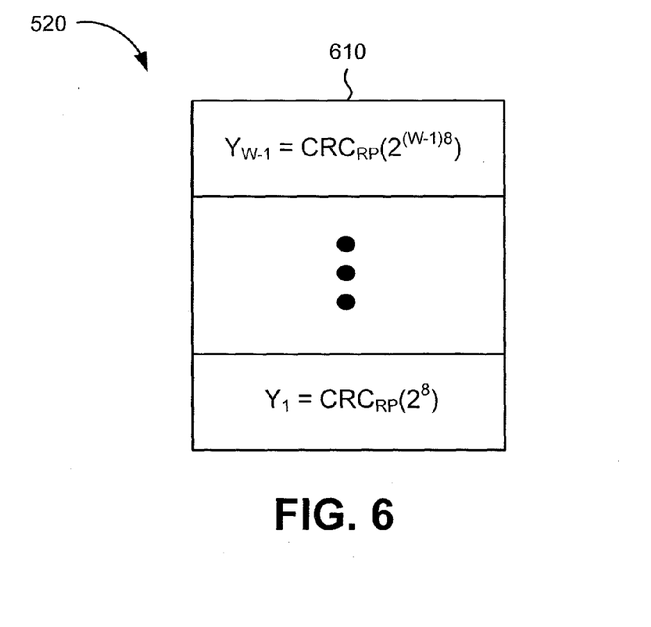
FIG. 6 is a diagram of example fields of a reciprocal cyclic redundancy check values look up table according to an implementation described herein.

FIG. 6 is a diagram of example fields of look up table 520 according to an implementation described herein. As shown in FIG. 6, look up table 520 may include CRC value entries 610. CRC value entries 610 may store CRC values corresponding to particular values of the packet remainder size, from N=1 to N=W−1, computed using a reciprocal CRC polynomial and a value corresponding to 2 to the power of the appended number of zeros (e.g, corresponding to the term $Y_{W-N}=CRC_{rp}(2^{(W-N)*8})$ from Equation (6)). The reciprocal CRC polynomial may be generated by reversing the bits of the CRC polynomial. In one implementation, the values stored in CRC value entries 610 may be pre-computed and implemented as an optimized digital circuit. In another implementation, the values stored in CRC value entries 610 may be implemented using another technique.

Although FIG. 6 shows example fields that may be stored in look up table 520, in other implementations, look up table 520 may include fewer fields, different fields, differently arranged fields, and/or additional fields than depicted in FIG. 6.

Figure 7:
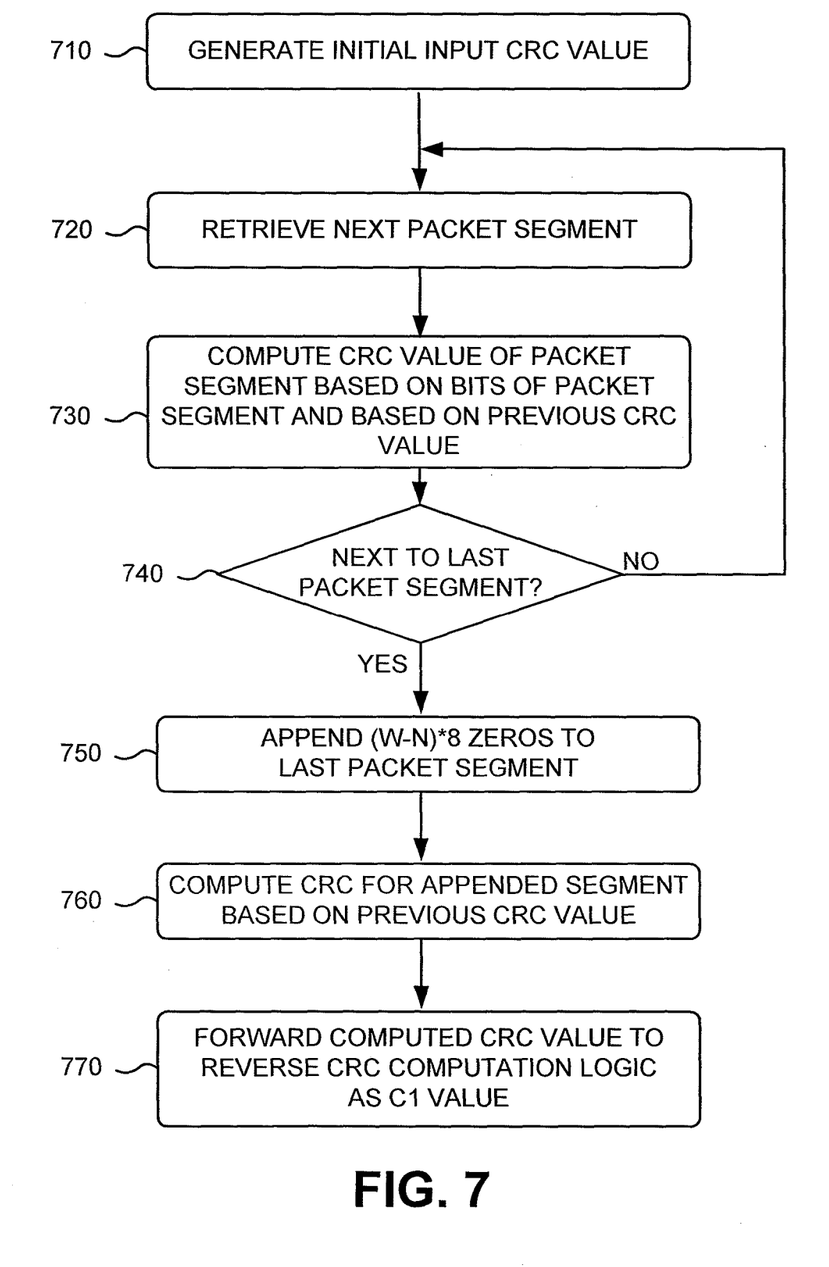
FIG. 7 is a diagram of a flow chart illustrating an example process for computing a cyclic redundancy check value according to an implementation described herein.

FIG. 7 is a diagram of a flow chart illustrating an example process for calculating a cyclic redundancy check value according to an implementation described herein. In one implementation, the process of FIG. 7 may be performed by network element 110. In other implementations, some or all of the process of FIG. 7 may be performed by another device or a group of devices separate and/or possibly remote from or including network element 110.

The process of FIG. 7 may include generating an initial input CRC value (block 710). For example, control logic 450 may generate an initial CRC value corresponding to k bits set to 1 and may provide the generated initial CRC value to fixed bit width CRC calculator 440. A next packet segment may be received (block 720). For example, packet buffer 430 may provide first packet segment 410-1 to fixed bit width CRC calculator 440.

A CRC value of the packet segment may be computed based on bits of the packet segment and based on a previous CRC value (block 730). For example, fixed bit width CRC calculator 440 may compute a CRC value based on the bits of first packet segment 410-1 and based on the initial CRC value corresponding to all bits set to 1, and may provide the computed CRC value to control logic 450.

A determination may be made as to whether the packet segment is a next to last packet segment (block 740). For example, control logic 450 may determine whether the next packet segment is the last packet segment, corresponding to packet remainder 415, or whether more packet segments remain to be processed.

If it is determined that the packet segment is not a next to last packet segment (block 740—NO), processing may return to block 720. For example, packet buffer 430 may provide a next packet segment to fixed bit width CRC calculator 440 and control logic 450 may provide the previous CRC value to fixed bit width CRC calculator 440, whereupon fixed bit width CRC calculator 440 may compute a next CRC value.

If it is determined that the packet segment is the next to last packet segment (block 740—YES), (W−N)*8 zeros may be appended to the last packet segment (block 750). For example, packet buffer 450 may append (W−N)*8 zeros to remainder 415, where W corresponds to the data path width and where N corresponds to the size of remainder 415. Packet buffer 450 may provide the appended packet remainder to fixed bit width CRC calculator 440 and may provide an indication to control logic 450 that appended packet remainder is the last packet segment.

A CRC of the appended packet segment may be computed based on the previous CRC value (block 750). For example, fixed bit width CRC calculator 440 may receive the appended packet remainder and a previous CRC value from control logic 450 to compute a 'k' bit CRC value for packet 405 with (W−N)*8 appended zeros.

The computed CRC value may be forwarded to reverse CRC computation logic as a C1 value (block 760). For example, control logic 450 may forward the 'k' bit CRC value for packet 405 with (W−N)*8 appended zeros to reverse CRC computation logic 460 as a $C_1$ value (e.g., corresponding to the $C_1$ value from Equation (4)).

Figure 8:
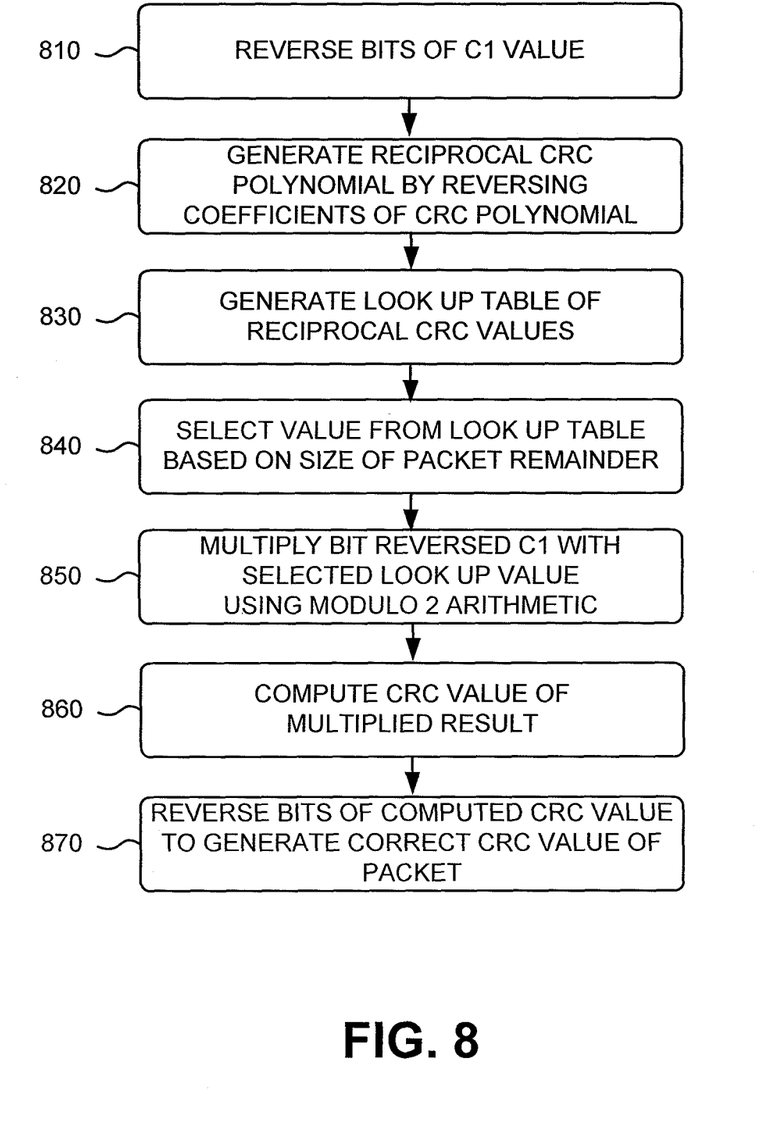
FIG. 8 is a diagram of a flow chart illustrating an example process for calculating a cyclic redundancy check value of a packet remainder according to an implementation described herein.

FIG. 8 is a diagram of a flow chart illustrating an example process for calculating a cyclic redundancy check value of a packet according to an implementation described herein. In one implementation, the process of FIG. 8 may be performed by network element 110. In other implementations, some or all of the process of FIG. 8 may be performed by another device or a group of devices separate and/or possibly remote from or including network element 110.

The process of FIG. 8 may include reversing bits of the computed C1 value may be reversed (block 810). For example, control logic 450 may provide the generated C1 value to first bit reverser 510, and first bit reverser 510 may reverse the bits of the generated C1 value.

A reciprocal CRC polynomial may be generated by reversing the coefficients of the CRC polynomial (block 820). For example, CRC component 420 may reverse the coefficients the CRC polynomial to generate a reciprocal CRC polynomial. A look up table of reciprocal CRC values may be generated (block 830). For example, CRC component 420 may use the reciprocal CRC polynomial to generate a reciprocal CRC value for value corresponding to the number of zeros that were appended to packet remainder 415 (e.g., by calculating value $Y_{W-N}$ from equation (6)). The generated reciprocal CRC values may be stored in look up table 520.

In one implementation of look up table 520, the values in reciprocal CRC values look up table 520 may be generated during manufacture, configuration, and/or programming of CRC component 420 (and/or reverse CRC computation logic 460). In another implementation of look up table 520, the values in look up table 520 may be generated during operation of CRC component 420 (and/or reverse CRC computation logic 460). For example, CRC component 420 (and/or reverse CRC computation logic 460) may not always use the same CRC polynomial, or may use a different CRC polynomial for different types of packets or when receiving packet 405 from a different source device 120. In such situations, CRC component 420 (and/or reverse CRC computation logic 460) may need to generate and/or recompute look up table 520 based on a different CRC polynomial. In yet another implementation, CRC component 420 (and/or reverse CRC computation logic 460) may include multiple versions of look up table 520, where a particular one of the multiple look up tables 520 corresponds to a particular CRC polynomial.

A value from the look up table may be selected based on the size of the packet remainder (block 840). For example, reverse CRC computation logic 460 may receive a value of W−N (corresponding to the size of remainder 415) from control unit 450 and may select a particular $Y_{W-N}$ value from look up table 520 based on the received W−N value. Look up table 520 may provide the selected $Y_{W-N}$ value to multiplier 530.

The bit reversed C1 value may be multiplied with the selected look up table value using modulo 2 arithmetic (block 850). For example, multiplier 530 may multiply the $Y_{W-N}$ value, computed or retrieved from look up table 520, with the bit reversed $C_1$ value using modulo 2 arithmetic. The resulting product may be 2k−1 bits long.

A CRC value may be computed for the multiplied result (block 860). For example, CRC calculator for 2k−1 bit input 540 may receive the multiplied result from multiplier 530 and may compute a CRC value for the multiplied result using the reverse CRC polynomial (e.g., using equation (6)).

Bits of the computed CRC value may be reversed to generate a correct CRC of the packet (block 870). For example, second bit reverser 550 may receive the computed CRC value from CRC calculator for 2k−1 bit input 540 and may reverse the bits of the received value to generate a correct CRC value 470 of packet 405 and CRC component 420 may output CRC value 470.

The foregoing description provides illustration and description, but is not intended to be exhaustive or to limit the invention to the precise form disclosed. Modifications and variations are possible in light of the above teachings or may be acquired from practice of the invention.

For example, while a series of blocks has been described with respect to FIGS. 7 and 8, the order of the blocks may be modified in other implementations. Further, non-dependent blocks may be performed in parallel.

Also, certain portions of the implementations may have been described as a "component," "calculator," "logic," "reverser," or "multiplier" that performs one or more functions. The terms "component," "calculator," "logic," "reverser," and "multiplier" may include hardware, such as a processor, an ASIC, or a FPGA, or a combination of hardware and software (e.g., software running on a processor).

It will be apparent that aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

It should be emphasized that the term "comprises/comprising" when used in this specification is taken to specify the presence of stated features, integers, steps, or components, but does not preclude the presence or addition of one or more other features, integers, steps, components, or groups thereof.

Even though particular combinations of features are recited in the claims and/or disclosed in the specification, these combinations are not intended to limit the invention. In fact, many of these features may be combined in ways not specifically recited in the claims and/or disclosed in the specification.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

What is claimed:

1. A communication device comprising:
 a cyclic redundancy check (CRC) calculator to:
  determine a packet remainder of a packet based on a data path width associated with the communication device;
  append zeros to the packet remainder to generate an appended packet remainder equal in size to the data path width;
  compute a first CRC value for the appended packet;
  reverse bits of the first CRC value to obtain a reversed CRC value;
  multiply the reversed CRC value by a value based on a reciprocal CRC polynomial to generate a multiplication product;
  compute a second CRC value for the multiplication product based on the reciprocal CRC polynomial; and
  reverse bits of the second CRC value to generate a particular CRC value for the packet.

2. The communication device of claim 1, where the CRC calculator is further to:
 receive a current packet segment of the packet,
  the current packet segment having a size corresponding to the data path width; and
 compute a current CRC value based on the current packet segment and a previous CRC value.

3. The communication device of claim 2,
 where the previous CRC value is based on an initial CRC value when the current packet segment corresponds to a first packet segment, and
 where the previous CRC value is based on a previous packet segment when the current packet segment does not correspond to the first packet segment.

4. The communication device of claim 2,
 where the particular CRC value corresponds to the current CRC value when the current packet segment corresponds to a last packet segment, and
 where the last packet segment corresponds to the packet remainder.

5. The communication device of claim 1, where the CRC calculator is further to:
 retrieve the value based on the reciprocal CRC polynomial from a look up table.

6. The communication device of claim 5,
 where the look up table relates a particular size of the packet remainder to a particular reciprocal CRC value,
 where the particular reciprocal CRC value is computed using the reciprocal CRC polynomial, and
 where the reciprocal CRC polynomial is obtained by reversing bits of a CRC polynomial used to compute the first CRC value.

7. The communication device of claim 6,
 where the CRC polynomial corresponds to an Ethernet polynomial, and
 where the reciprocal CRC polynomial corresponds to the Ethernet polynomial with reversed bits.

8. The communication device of claim 1, where the CRC calculator is further to:
 generate the reciprocal CRC polynomial by reversing bits of a CRC polynomial,
  the CRC polynomial being used to compute the first CRC value, and
  the second CRC value being computed using the reciprocal CRC polynomial; and
 calculate the value based on the reciprocal CRC polynomial based on a CRC function, the generated reciprocal CRC polynomial, and a quantity of the zeros that were appended to the packet remainder.

9. The communication device of claim 1, where the reversed CRC value is multiplied by the value based on the reciprocal CRC polynomial.

10. A method comprising:
 determining, by a communication device, a packet remainder of a packet based on a data path width associated with the communication device;
 appending, by the communication device, zeros to the packet remainder to generate an appended packet remainder equal in size to the data path width;

computing, by the communication device, a first cyclic redundancy check (CRC) value for the appended packet;
reversing, by the communication device, bits of the first CRC value to obtain a bit reversed CRC value;
multiplying, by the communication device, the bit reversed CRC value a value based on a reciprocal CRC polynomial to generate a multiplication product;
computing, by the communication device, a second CRC value for the multiplication product; and
reversing, by the communication device, bits of the second CRC value to generate a CRC value for the packet.

11. The method of claim 10, further comprising:
receiving a current packet segment of the packet,
the current packet segment having a size corresponding to the data path width; and
computing a current CRC value based on the current packet segment and a previous CRC value.

12. The method of claim 11,
where the previous CRC value is based on an initial CRC value when the current packet segment corresponds to a first packet segment, and
where the previous CRC value is based on a previous packet segment when the current packet segment does not correspond to the first packet segment.

13. The method of claim 11,
where the CRC value for the packet corresponds to the current CRC value when the current packet segment corresponds to last packet segment, and
where the last packet segment corresponds to the packet remainder.

14. The method of claim 10, further comprising:
retrieving the value based on the reciprocal CRC polynomial from a look up table.

15. The method of claim 14,
where the look up table relates a particular size of the packet remainder to the particular reciprocal CRC value,
where the particular reciprocal CRC value is computed using a reciprocal CRC polynomial, and
where the reciprocal CRC polynomial is obtained by reversing bits of a CRC polynomial used to compute the first CRC value.

16. The method of claim 10, further comprising:
generating the reciprocal CRC polynomial by reversing bits of a CRC polynomial,
the CRC polynomial being used to compute the first CRC value, and
the second CRC value being computed using the reciprocal CRC polynomial; and
calculating the value based on the reciprocal CRC polynomial based on a CRC function, the reciprocal CRC polynomial, and a quantity of the zeros that were appended to the packet remainder.

17. The method of claim 10, where multiplying the bit reversed CRC value by the value based on the reciprocal CRC polynomial comprises:
using modulo 2 arithmetic to generate the multiplication product.

18. A non-transitory computer-readable medium storing instructions, the instructions comprising:
one or more instructions that, when executed by at least one processor of a communication device, to cause the at least one processor to:
determine a packet remainder for a packet based on a data path width associated with the communication device;
append zeros to the packet remainder to generate an appended packet remainder equal in size to the data path width;
compute a first CRC value for the packet after appending the zeros to the packet;
reverse bits of the first CRC value to obtain a bit reversed CRC value;
multiply the bit reversed CRC value by a value based on a reciprocal CRC polynomial to generate a multiplication product;
compute a second CRC value for the generated multiplication product based on the reciprocal CRC polynomial; and
reverse bits of the second CRC value to generate a CRC value for the packet.

19. The non-transitory computer-readable medium of claim 18, where the instructions further comprise:
one or more instructions that, when executed by the at least one processor, to cause the at least one processor to:
generate the reciprocal CRC polynomial by reversing bits of a CRC polynomial,
the CRC polynomial being used to compute the first CRC value, and
the second CRC value being computed using the reciprocal CRC polynomial; and
calculate the value based on the reciprocal CRC polynomial, based on a CRC function, the reciprocal CRC polynomial, and a quantity of the zeros that were appended to the packet remainder.

20. The non-transitory computer-readable medium of claim 18, where the instructions further comprise:
one or more instructions that, when executed by the at least one processor, to cause the at least one processor to:
receive a packet;
determine that the packet has a size that is not a multiple of the data path width;
divide the packet into one or more packet segments,
a particular packet segment having a size corresponding to the data path width; and
generate the packet remainder, where
the packet remainder having a size that is less than the data path width.

* * * * *

UNITED STATES PATENT AND TRADEMARK OFFICE
CERTIFICATE OF CORRECTION

PATENT NO. : 8,578,240 B1
APPLICATION NO. : 13/011445
DATED : November 5, 2013
INVENTOR(S) : Ravi Pathakota et al.

Page 1 of 1

It is certified that error appears in the above-identified patent and that said Letters Patent is hereby corrected as shown below:

In the Claims

Claim 20 (Column 14, Line 52) should read as follows:

generate the packet remainder, the packet

Signed and Sealed this
Eighteenth Day of March, 2014

Michelle K. Lee
*Deputy Director of the United States Patent and Trademark Office*